US009414477B2

(12) United States Patent
Loopstra et al.

(10) Patent No.: US 9,414,477 B2
(45) Date of Patent: Aug. 9, 2016

(54) RADIATION SOURCE, LITHOGRAPHIC APPARATUS AND DEVICE MANUFACTURING METHOD

(75) Inventors: Erik Roelof Loopstra, Eindhoven (NL); Jan Bernard Plechelmus Van Schoot, Eindhoven (NL); Gerardus Hubertus Petrus Maria Swinkels, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 905 days.

(21) Appl. No.: 12/540,548

(22) Filed: Aug. 13, 2009

(65) Prior Publication Data

US 2010/0044591 A1 Feb. 25, 2010

Related U.S. Application Data

(60) Provisional application No. 61/136,151, filed on Aug. 14, 2008, provisional application No. 61/136,871, filed on Oct. 10, 2008.

(51) Int. Cl.
*H05G 2/00* (2006.01)
*G03F 7/20* (2006.01)

(52) U.S. Cl.
CPC ............ *H05G 2/001* (2013.01); *G03F 7/70033* (2013.01); *G03F 7/7085* (2013.01)

(58) Field of Classification Search
USPC .......... 250/492.1, 492.2, 493.1, 503.1, 504 R
See application file for complete search history.

(56) References Cited

U.S. PATENT DOCUMENTS

| | | | | |
|---|---|---|---|---|
| 4,793,715 | A | 12/1988 | Kasner et al. | |
| 5,936,720 | A | 8/1999 | Neal et al. | |
| 6,784,408 | B1 | 8/2004 | Cheung et al. | 250/201.9 |
| 6,816,302 | B2 * | 11/2004 | Sandstrom et al. | 359/291 |
| 2005/0230645 | A1 * | 10/2005 | Melnychuk et al. | 250/504 R |

FOREIGN PATENT DOCUMENTS

| | | | |
|---|---|---|---|
| DE | 10149654 | | 4/2003 |
| JP | 09-184900 | A | 7/1997 |
| JP | 2003270551 | | 9/2003 |
| JP | 2003272892 | | 9/2003 |
| JP | 2007-109451 | A | 4/2007 |
| JP | 2009-252991 | A | 10/2009 |

OTHER PUBLICATIONS

European Search Report dated Nov. 12, 2010 in related European patent application No. 09164844.

(Continued)

*Primary Examiner* — Robert Kim
*Assistant Examiner* — Hanway Chang
(74) *Attorney, Agent, or Firm* — Pillsbury Winthrop Shaw Pittman LLP

(57) ABSTRACT

A radiation source includes a beam generator configured to generate a radiation beam to be used to produce a radiation output of the radiation source, and a beam monitor, configured to monitor the radiation beam. A lithographic apparatus includes the radiation source. A device manufacturing method includes generating a first type of radiation by utilizing a beam of a second type of radiation, monitoring a quality of the second type of radiation, and projecting a patterned beam of the first type of radiation onto a substrate.

16 Claims, 6 Drawing Sheets

(56) References Cited

OTHER PUBLICATIONS

Japanese Office Action for Japanese Patent Application No. 2009-182956, mailed on Jul. 21, 2011.

European Office Action for European Patent Application No. 09164844.4, mailed on May 27, 2011.

European Examination Report dated Dec. 7, 2012 in corresponding European Patent Application No. 09 164 844.4.

* cited by examiner

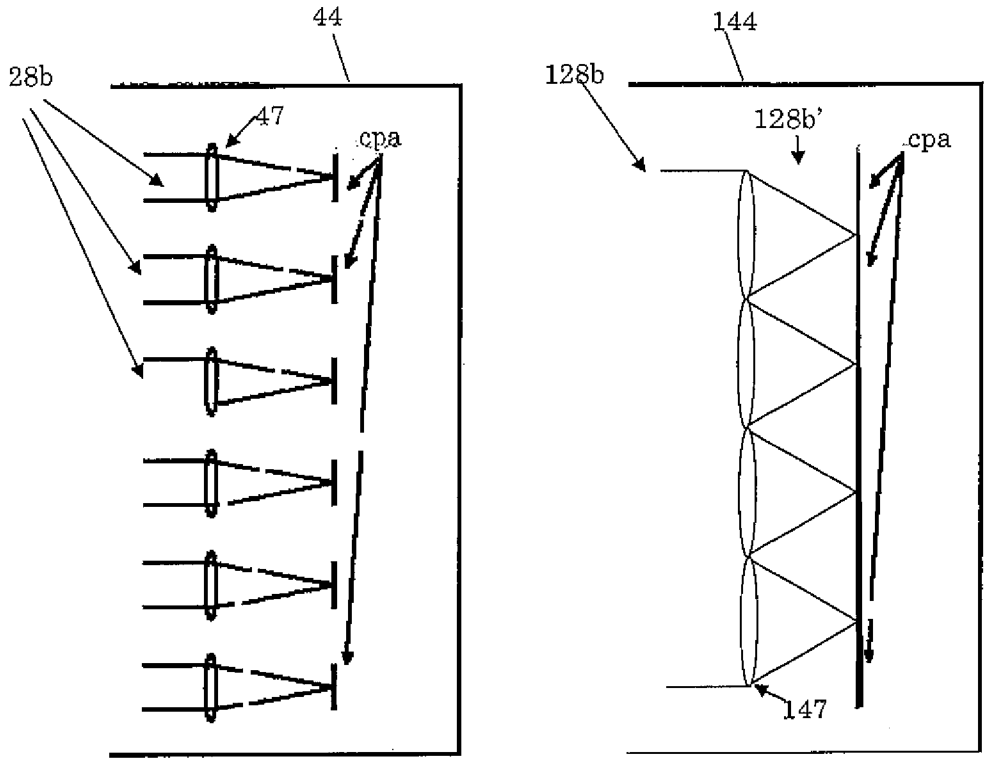
FIG. 6A
FIG. 6B
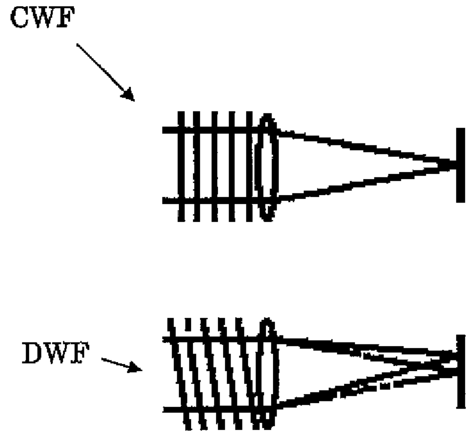
FIG. 7

RADIATION SOURCE, LITHOGRAPHIC APPARATUS AND DEVICE MANUFACTURING METHOD

CROSS-REFERENCE TO RELATED APPLICATIONS

This application claims the benefit of priority from U.S. Provisional Patent Application Ser. Nos. 61/136,151, filed on Aug. 14, 2008, and 61/136,871, filed on Oct. 10, 2008, the contents of which are both incorporated herein by reference in their entireties.

FIELD

The present invention relates to a radiation source, a lithographic apparatus, and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In order to be able to project ever smaller structures onto substrates, it has been proposed to use EUV radiation which is electromagnetic radiation having a wavelength selected from the range of 10-20 nm, for example the range of 13-14 nm. It has further been proposed that EUV radiation with a wavelength of less than 10 nm could be used, for example selected from the range of 5-10 nm, for example 6.7 nm or 6.8 nm.

Radiation may be produced in the radiation source using plasma. The plasma may be created for example by directing a laser beam at a plasma fuel, the fuel for example including or consisting of particles of a suitable material (e.g. tin), or by directing a laser at a stream of a suitable gas or vapor (acting as a plasma fuel), for example Xe gas or Li vapor. The resulting plasma emits radiation, for example EUV radiation may be collected using a collector, which receives the radiation and may focus the radiation into a beam. Such a radiation source is typically called a laser produced plasma (LPP) radiation source, for example an EUV LPP radiation source.

SUMMARY

It is desirable to provide an improved radiation source. Particularly, it is desirable to provide a radiation source that can generate a radiation output of high quality, that is stable utilizing a radiation beam.

According to an aspect of the invention, a radiation source may comprise a beam generator configured to generate a radiation beam, to be used to produce a radiation output of the radiation source, wherein the source further comprises a beam monitor configured to monitor the radiation beam.

According to an aspect of the invention, there is provided a lithographic apparatus configured to project a pattern from a patterning device onto a substrate. The lithographic apparatus includes the above-mentioned radiation source. The lithographic apparatus may also include a support configured to support a patterning device, the patterning device being configured to pattern the radiation output of the radiation source into a patterned beam of radiation, and a projection system configured to project the patterned beam of radiation onto a substrate.

According to an aspect of the invention, there is provided a device manufacturing method that includes projecting a patterned beam of radiation onto a substrate. The radiation is generated by the above-mentioned radiation source.

According to an aspect of the invention, there is provided a device manufacturing method that includes generating a first type of radiation utilizing a beam of a second type of radiation, and monitoring a quality of the beam of the second type of radiation, as well as projecting a patterned beam of the first type of radiation onto a substrate.

According to an aspect of the invention, there is provided a lithographic apparatus that includes a radiation source. The radiation source includes a beam generator configured to generate a radiation beam to produce a radiation output of the radiation source, and a beam monitor configured to monitor the radiation beam. The apparatus includes a support configured to support a patterning device, the patterning device being configured to pattern the radiation output by the radiation source, and a projection system configured to project a patterned beam of radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6A schematically depicts a detail of an analyzer module of a beam quality monitor according to an embodiment of the invention;

FIG. 6B schematically depicts a detail of an analyzer module of a beam quality monitor according to an embodiment of the invention;

FIG. 7 schematically depicts the principle of operation of an analyzer module of a beam quality monitor according to an embodiment of the invention.

DETAILED DESCRIPTION

Figure 1:
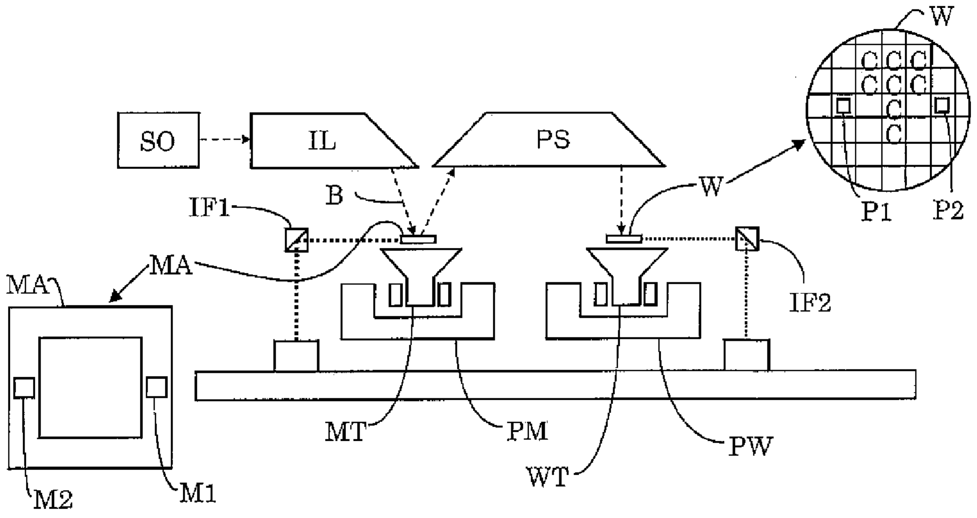
FIG. 1 schematically depicts a lithographic apparatus according to an embodiment of the invention.

FIG. 1 schematically depicts a lithographic apparatus according to one embodiment of the invention. For example, the apparatus may comprise: an illumination system (illuminator) IL configured to condition a radiation beam B of radiation. The apparatus also includes a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive or reflective projection lens system) PS configured to project a pattern imparted to the radiation beam B by patterning device MA onto a target portion C (e.g. comprising one or more dies) of the substrate W.

The illumination system may include various types of optical components, for example refractive, reflective, magnetic, electromagnetic, electrostatic or other types of optical components, or any combination thereof, for one or more of directing radiation, shaping radiation, and controlling radiation.

The support structure MT may hold the patterning device in a manner that depends on the orientation of the patterning device, the design of the lithographic apparatus, and other conditions, for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms “reticle” or “mask” herein may be considered synonymous with the more general term “patterning device.”

The term “patterning device” used herein should be broadly interpreted as referring to any device that can be used to impart a radiation beam with a pattern in its cross-section for example to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, for example an integrated circuit.

The patterning device may be reflective. Examples of patterning devices include masks, programmable mirror arrays, and programmable LCD panels. Masks are well known in lithography, and include mask types for example binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term “projection system” used herein should be broadly interpreted as encompassing any type of projection system, including refractive, reflective, catadioptric, magnetic, electromagnetic and electrostatic optical systems, or any combination thereof, as appropriate for the exposure radiation being used. Any use of the term “projection lens” herein may be considered as synonymous with the more general term “projection system”.

As here depicted, the apparatus is of a reflective type (e.g. employing a reflective mask).

The lithographic apparatus may be of a type having two (dual stage) or more substrate tables (and/or two or more patterning device tables). In such “multiple stage” machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities. In such cases, the source is not considered to form part of the lithographic apparatus and the radiation beam is passed from the source SO to the apparatus (for example to the illuminator IL) with the aid of a beam delivery system comprising, for example, suitable directing mirrors and/or a beam expander. In other cases the source may be an integral part of the lithographic apparatus. The source SO and the illuminator IL, together with the beam delivery system if required, may be referred to as a radiation system. According to an embodiment, the source SO may be an LPP source, for example comprising a $CO_2$ laser or a different type of laser to produce a laser beam.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, for example an integrator and a condenser. The illuminator may be used to condition the radiation beam, to have a desired uniformity and intensity distribution in its cross-section.

In the present example, the radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, for example a programmable mirror array of a type as referred to above.

Combinations and/or variations on the above described modes of use or entirely different modes of use may also be employed.

Figure 2:
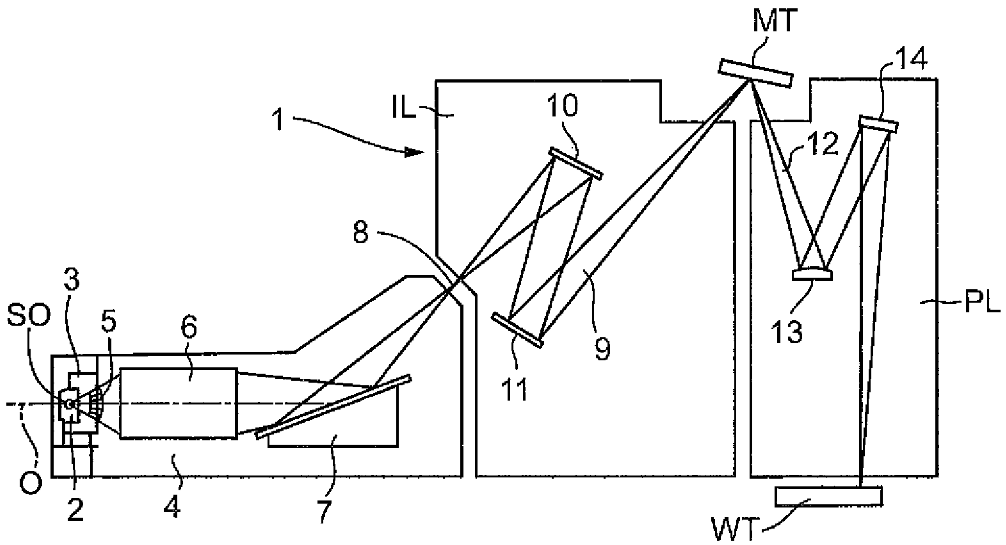
FIG. 2 depicts a detailed schematic illustration of a lithographic apparatus according to an embodiment of the invention.

FIG. 2 shows an example of the apparatus in more detail, the example including a radiation source SO, an illumination optics unit IL, and a projection system PL. The radiation source SO includes a radiation emitter 2. In FIG. 2, the emitter comprises a plasma. EUV radiation may be produced by a gas or vapor, for example Xe gas or Li vapor in which a very hot plasma is created to emit radiation in the EUV radiation range of the electromagnetic spectrum. In this embodiment, the very hot (radiation emitting) plasma is created by causing a partially ionized plasma of an electrical discharge to collapse onto an optical axis O. Partial pressures of e.g. 10 Pa of Xe or Li vapor or any other suitable gas or vapor may be desired for efficient generation of the radiation. In some embodiments, tin may be used. The radiation emitted by radiation emitter 2 is passed from a source chamber 3 into a collector chamber 4. In an embodiment, the radiation source SO includes the source chamber 3 and collector chamber 4. Alternatively, the source can be an LPP source (which does not make use of an electrical discharge to collapse plasma). An example of the LPP source is depicted in FIG. 3.

As shown in FIG. 2, the collector chamber 4 includes a contamination trap 5 and grazing incidence collector 6 (shown schematically as a rectangle). Alternatively, the apparatus can include a normal incidence collector, to collect radiation from the source SO (for example in case the source is a LPP source). Radiation allowed to pass through the collector 6 is reflected off a grating spectral filter 7 to be focused in a virtual source point 8 at an aperture in the collector chamber 4. From collector chamber 4, a beam of radiation 9 is reflected in illumination optics unit IL via first and second normal incidence reflectors 10, 11 onto a patterning device (e.g., a mask) positioned on support structure MT. A patterned beam 12 is formed which is imaged in projection system PL via first and second reflective elements 13, 14 onto a substrate (not shown) held on a substrate table WT. More elements than shown may generally be present in illumination optics unit IL and projection system PL.

Figure 3:
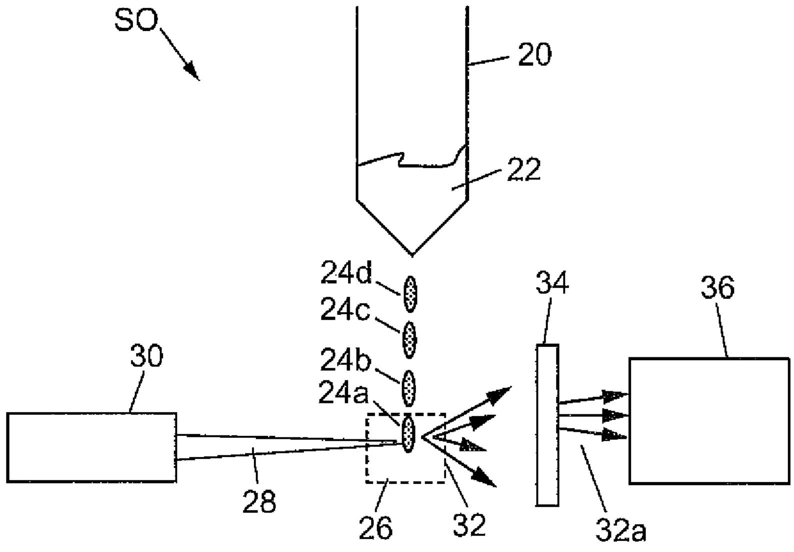
FIG. 3 schematically depicts a radiation source according to an embodiment of the invention.

FIG. 3 schematically depicts a radiation source according to an embodiment of the invention. For example, the source SO may comprise a beam generator 30 configured to generate a radiation beam 28 of radiation, particularly coherent radiation, to be used to produce a radiation output 32*a* of the radiation source SO. In the present embodiment, the beam generator 30 is a laser, configured to emit a laser beam 28. As will be explained below, according to an embodiment of the invention, a beam monitor 40 is provided, configured to monitor the radiation beam 28. Non-limiting example of the beam monitor 40 are depicted in FIGS. 4-8.

For example, operation of the source SO may be part of a device manufacturing method. The method can include generating a first type of radiation 32*a* (i.e., the radiation output, for example EUV radiation), utilizing the beam 28 of a second type of radiation (for example laser light), projecting a patterned beam of the first type of radiation onto a substrate W, as well as monitoring a quality of the beam 28 of second type of radiation. In an embodiment, monitoring the beam quality can be carried out during a device manufacturing method of projecting a patterned beam of radiation onto a substrate W, the radiation being generated by the radiation source SO.

More particularly, as follows from the drawing, the source SO may comprise a fuel supplier 20 configured to supply a plasma fuel to a fuel ignition location 26. The source SO may comprise a laser 30 configured to emit a laser beam 28 to ignite fuel, present at the ignition location 26, to generate radiation emitting plasma Q (see FIGS. 4-5).

As follows from FIGS. 3-5, the radiation source SO may be configured to focus at least part of the laser beam 28 onto a focus spot 26 (the focus spot being the afore-mentioned fuel ignition location). In that case the beam monitor 40 can be configured to determine a quality of the laser beam 28 that relates to one or more of a size, shape, intensity and location of the laser beam 28 in the focus spot 26, as will be explained below. By determining the beam quality (for example during a lithographic device manufacturing method), a desired high beam quality can be achieved, leading to a desired stable and efficient radiation emitting plasma Q and therefore a desired high quality radiation output.

In the present embodiment (see FIG. 4), the source SO comprises an optical system PFL, 42 configured to focus at least part of the radiation bean 28 onto the focus spot 26. The optical focussing unit can be configured in various ways, and can be provided by one or more optical elements (for example one or more mirrors, one or more lenses). In the example, the focussing unit includes a pumplaser focussing lens PFL, configured to focus light that is emitted by the laser 30. The focussing unit can also include a mirror to focus at least part of the radiation beam onto the focus spot 26. For example, the focussing unit PFL can be part of the laser device 30, or be a separate component. In an embodiment, one or more laser beam steering devices, for example mirrors, may be provided to redirect the laser beam 28. FIG. 4 illustrates one such beam steering device: a reflector 42, located downstream with respect to the pumplaser focussing unit PFL, to change direction of incoming laser light towards a desired fuel ignition location 26.

In an alternative embodiment, for example, an afore-mentioned beam steering device can be located upstream with respect to the focussing unit PFL. In that case, the beam steering device can be configured to redirect laser light towards the focussing lens, to be focussed onto the focus spot 26.

Also, the radiation source SO may comprise a fuel supplier 20 configured to supply the plasma fuel to the fuel ignition location 26.

For example, the fuel supplier 20 may comprise a container arranged with a liquefied target material 22 (i.e. plasma fuel), for example Sn or Gd. The container 20 may be arranged with a suitable mechanism or opening (not shown) configured to deliver liquid droplets 24*a*, 24*b*, 24*c*, 24*d* of Sn or Gd to the region 26 (i.e. the ignition location) wherein a droplet is configured to be impinged by the laser beam 28 provided by the laser 30. The laser beam 28 may relate to a $CO_2$ laser having a respective (infrared) wavelength, for example 10.6 micrometers or 9.4 micrometers. Alternatively, other suitable lasers may be used, for example having respective wavelengths in the range of 1-11 micrometers. The laser beam 28 is desirably focused in the region 26 using a suitable optical system PFL, 42, 142 (examples are shown in FIGS. 4 and 5). Upon interaction with the laser beam 28, the droplets 24*a*, 24*b*, 24*c*, 24*d* are transferred into a plasma state which may emit, for example, 6.7 nm radiation, or any other EUV radiation selected from the range of 5-20 nm, or a different type of radiation.

The emanating beam 32 may be intercepted by a suitable debris mitigation system 34, for example contamination trap 5, configured to collect or to deflect particle debris emanating from the region 26. The beam 32*a* substantially free of debris may then enter a subsequent optical system 36 of the radiation source or of the lithographic apparatus, for example illumination system IL of the lithographic apparatus configured to suitably condition the beam 32*a*. The radiation source SO may include a buffer gas for cooperating with a source of laser produced plasma. The buffer gas may have at least 50% transmission for EUV radiation, and at least 70% absorption for secondary radiation. Desirably, the buffer gas has at least 90% or at least 95% transmission for EUV radiation. It is desirable that the buffer gas has at least 90% absorption for secondary radiation.

If the quality of the laser beam 28 focused at region 26 degrades, the size of the beam in the focus spot will increase, leading to a decreased conversion efficiency. Also, degradation of the laser beam may involve a decrease of the beam's shape and a beam intensity in the focus spot, and/or a displacement of the beam with respect to a desired focus spot. As a result, the output power of the radiation source SO may decrease and/or show increased instability. An aspect of the present invention solves or reduces this problem, by providing an aforementioned laser beam monitor 40.

In the present embodiment, at least part of the optical system of the source SO is part of the laser beam monitor. In the present embodiment, both the focussing unit PFL and the beam steering device 42 control the laser beam 28, to be analyzed by an analyzer module 44, 144, 244.

In the examples (see FIGS. 4-5), laser beam focussing unit PFL may be arranged to focus at least part 28*a* of the laser beam 28 onto the first focus spot 26 to produce the radiation output. In the present embodiment, the focussing unit PFL is also arranged to focus at least part 28*b*, 128*b* of the laser beam 28 onto a second focus spot F2, separate from the first focus spot, the second focus spot F2 being associated with the analyzer 44, 144. In the present embodiment, the focussing unit PFL can cooperate with the beam steering device 42, to provide different focus spots 26, F2.

For example, in the present embodiment, the beam steering device 42 is configured to direct at least part of the laser beam 28 towards the plasma fuel ignition location 26, wherein the beam steering device 42 is also configured to direct at least part of the laser beam 28 towards a beam analyzing location (i.e. analyzer 44) to be analyzed.

The beam steering device can be configured in various ways, For example, the beam steering device can be provided with a movable beam controller, for example a movable reflector. For example, the beam controller can be movable to a first position, into a path of the laser beam 28, to redirect the laser beam towards a first direction (for example towards the fuel ignition location). Then, for example, the beam controller can be movable to a second position, for example out of the path of the laser beam 28, to pass without being redirected, for example to reach a beam analyzer 44. Alternatively, for example, a movable beam controller can be movable to a second position that is in the path of the laser beam 28, to redirect the laser beam 28 towards a second direction that differs from the first direction (for example to reach a beam analyzer).

Figure 4:
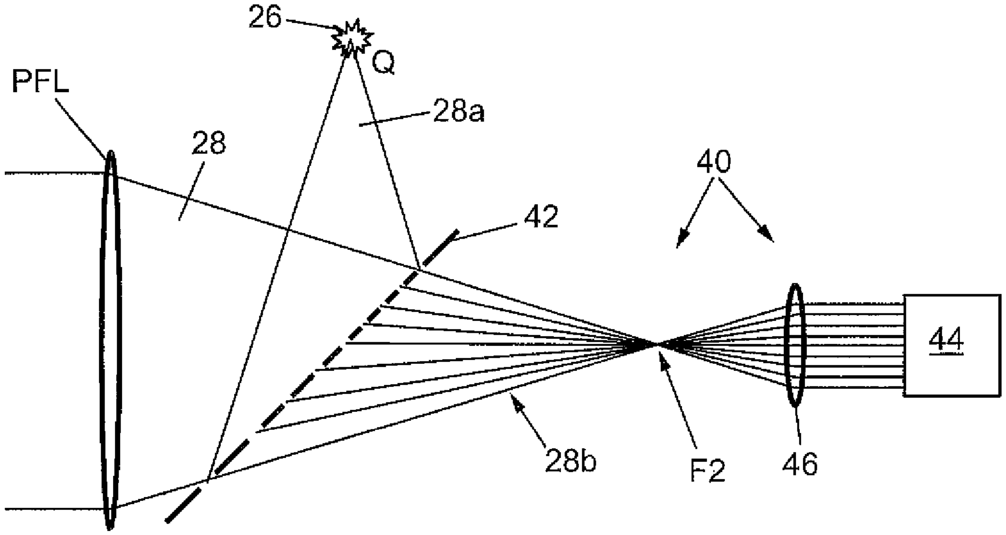
FIG. 4 schematically depicts a beam quality monitor according to an embodiment of the invention.
Figure 5:
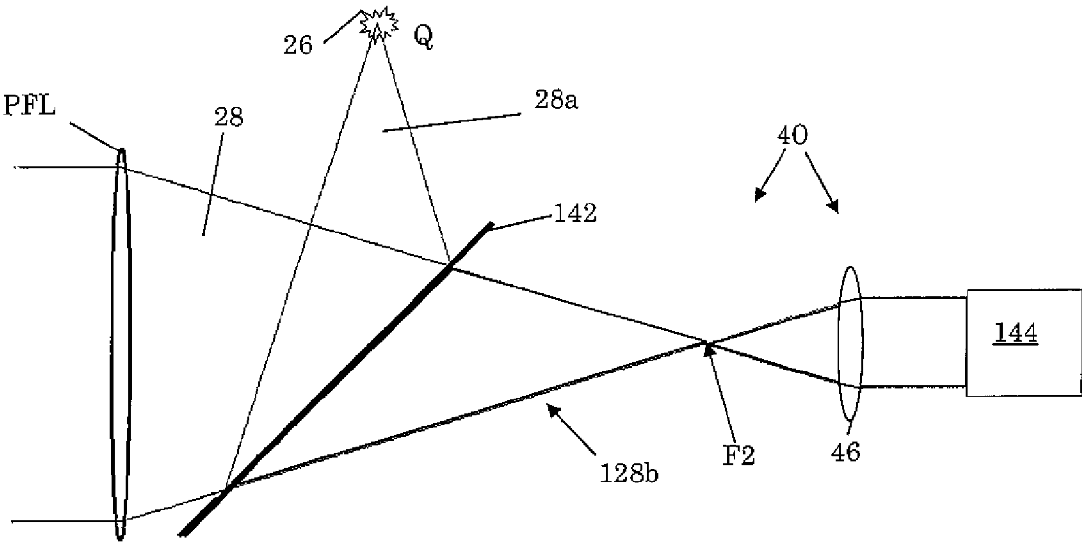
FIG. 5 schematically depicts a beam quality monitor according to an embodiment of the invention.

In the present examples, the beam steering device is provided by a stationary beam controller 42 (see FIGS. 4-5). For example, the beam steering device can include a beam splitter 42, configured to split at least part of the incoming laser beam 28 at least into a first beam part 28*a* and one or more second beam parts 28*b*, 128*b* (the first and second beam parts 28*a*, 28*b* generally propagating along mutually different directions). In the present example, the beam splitter 42 reflects the first beam part 28*a*, and allows the second part(s) 28*b*, 128*b* to pass. However, the splitter 42 can also be configured in a different manner, for example, to allow both beam parts to pass, but in different directions, or to reflect the two beam parts into different directions.

Alternatively, for example, the beam steering device and focussing unit can be integrated with each other. For example the focussing unit can be a radiation reflector that is semi-transparent, to reflect and focus a first part of the incoming laser radiation onto a first focus spot 26, and to allow part of the incoming laser radiation to pass the reflector towards a radiation analyzer.

Also, in an embodiment, the focussing unit PFL can be movable to provide a desired beam steering. As an example, the focussing unit PFL can be movable to a first position direct at least part of the radiation beam towards the plasma fuel ignition location, wherein the focussing unit PFL can be adjusted from the first position into a second position to direct at least part of the radiation beam towards the beam analyzing location.

As follows from FIG. 4, the beam splitter 42 may be configured to provide a plurality of (relatively narrow) second beam parts 28*b*. Particularly, the present beam splitter may act as a beam divider, dividing at least part of the incoming laser beam 28 into a plurality of parts 28*b* (to be analyzed).

In an embodiment, as is shown in FIG. 5, the beam splitter 142 as such can be configured to provide a single second beam part 128*b*, for example in case the beam splitter is provided by a semi-transparent reflector 142. For example, the beam splitter can be provided by a single layer or a multi-layer mirror 142 (for example having a mirror substrate that is substantially transparent to the laser beam radiation), the mirror 142 being configured to reflect a first part of the laser beam 28 and to allow a second beam part 128*b* to be transmitted there-through (the second beam part 128*b* preferably including less than 1% of the incoming beam 28, more preferably at most 0.1%). The semi-transparent reflector 142 can allow a full wavefront of the incoming radiation beam 28 to be analyzed. Also, an optional beam divider can be available (to divide a single second beam into a plurality of second beams), for example being located between the semi-transparent reflector (acting as beam splitter) and an analyzer module 144, or by being part of the analyzer module 144.

According to an embodiment, the beam monitor 40 may comprise a wavefront sensor, configured to determine wavefront deviations in the radiation beam. The wavefront sensor can be configured in different ways. In the present example, the sensor is part of an analyzer module 44, 144 (see also FIGS. 6A, 6B). For example, the analyzer module 44, 144 can be configured to detect wavefront phase deviations (of the laser beam 28) with respect to a predetermined (desired) wavefront, the predetermined wavefront being associated with the beam being in focus on the ignition location.

For example, according to an embodiment of the invention, a beam quality monitor 40 may be provided in a LPP radiation source or be associated with a respective radiation source, for example an EUV LPP radiation source. In an embodiment, the beam quality of the laser beam 28 can be measured by a so called Shack-Hartmann interferometer 40, which is generally and schematically depicted in FIGS. 4-5. The Shack-Hartmann device 40 as such call be configured in various different ways.

Referring to FIG. 4, for example the laser beam 28 may be sampled, leading to the plurality of beam parts 28*b*, for example emanating from different radial or lateral beam locations (viewed from an optical axis of the beam, see FIG. 4). In the present embodiment, the laser beam 28 is sampled by the afore-mentioned beam divider (beam splitter) 42. In the present example, the beam divider is a mirror 42 having small apertures. Each aperture lets through a part of the incoming wave front of the laser beam 28. Thus, at least part of the radiation incident on the mirror 42 forms a plurality of individual beamlets 28*b*, each corresponding to a respective mirror aperture. In an embodiment, the mirror 42 may be a programmable mirror array where select mirrors of the array deflect parts of the beam to the analyzer module 44. Alternative examples of a beam divider are mentioned above. According to an example, the total aperture area in the beam dividing mirror 42 can be kept below 1%, preferably 0.1% or less, thus leading to minimal energy loss of the laser beam 28. For example, the beam divider 42 can be configured to provide a second beam part 28*b* consisting of less than 1%, preferably 0.1% or less, of the incoming radiation 28. As is mentioned before, FIG. 5 depicts an example wherein the laser beam 28 is not sampled by the beam splitter.

In the present examples, the second beam(s) 28*b*, 128*b* is/are incident on a detector in the analyzer module 44, 144. For example (see FIGS. 4, 5), the beamlets 28*b* or second beam 128*b* can be converging, and may be focussed onto a focus point F2. In the example, the focussing of the second beam(s) 28*b*, 128*b* is the result of the focusing action of the pump laser focussing focusing unit PFL. The example includes a collimator, particularly a lens 46, arranged to collimate the second beam(s) 28*b*, 128*b*. To that aim, the second focus point F2 may coincide with a focal point of the lens 46 (as in FIG. 4).

The collimator 46 can have various configurations. For example, the collimator can be a lens or a mirror. In the drawings, the collimator is shown as being a positive (converging) lens, located after the second focus point F2. In an alternative embodiment, the collimator can be a negative (diverging) lens having a focal point that coincides with the second focus point F2, the negative lens being located before the second focus point F2, to collimate the second beam(s) 28*b*, 128*b* before actually reaching the second focus point.

The collimated beamlets 28*b* (or beam 128*b*) propagate(s) towards a radiation detection part cpa of the analyzer module 44, 144. The analyzer module can be configured in different ways to detect incoming beamlets. Referring to FIG. 6A, the analyzer module 44 comprises one or more radiation detectors cpa, for example charge coupled detectors (CCDs). As will be apparent, another type of detector may be used. In an embodiment, the analyzer module comprises a two dimensional array of simple CCD's with small pixels, each CCD corresponding to a respective part 28*b* of the laser beam 28 from the mirror 42. Optionally, an attenuator may be located in the laser beam path before the CCD to limit or prevent damage of the CCD. As follows from FIG. 6A, each radiation detector may be associated with a respective beam focussing device, for example a lens 47, configured to focus a beamlet 28*b* (emanating from the collimator lens 46) onto a radiation detector cpa. FIG. 6B depicts an alternative embodiment of a module 144, which relates to the FIG. 5 arrangement, wherein one or each radiation detector is associated with a respective beam focussing system 147, configured to focus at least part of an incoming second beam 128*b* onto a radiation detector cpa. In FIG. 6B, the focussing system 147 is configured to focus a plurality of parts 128*b*' of the second beam 128*b* onto respective focus spots on the detector cpa.

In the present example, if a part of the wave front of the laser beam 28 is distorted, it will lead in the analyzer module 44, 144 to a shift of the detected position (in this case a focus position) of the applicable parts/beamlets 28*b*, 128*b*'. With all the shifts of the different parts/beamlets of the laser beam 28, the incoming wave front can be reconstructed, or at least estimated.

FIG. 7 schematically depicts such a shift of the focus position with the top of FIG. 7 showing a correct wave front CWF incident on a measurement surface of the analyzer module 44 and the bottom of FIG. 7 showing a distorted wave front DWF incident on the measurement surface, the position on the measurement surface shifted laterally relative to the correct wave front shown in the top of FIG. 7 due to the distortion of the wave front.

Thus, if the measured wave front has a deviation from an ideal wave front this deviation may appear as a positional deviation of a converging position of the measured wave front from a converging position of the ideal wave front on the measurement surface. The wave front can thereby be measured based on the positional deviation of the position of each individual beampart 28*b*, 128*b*' (of the beam from the mirror 42).

Calibration of the analyzer module 44, 144 may be performed by providing it with a beam (for example a laser beam generated by the laser 30) corresponding to an optimal focus at the focus spot 26 (in the radiation source SO). The position of each of the parts 28*b*, 128*b*' of the laser beam 28 on the respective detectors cpa can be used as a reference position, from which to determine a shift in position due to a distorted wave front, so precise alignment of the detectors cpa and one or more associated optical elements (e.g., lenses 46, 47) would not be needed.

Preferably, the analyzed signal is used to achieve and/or maintain a desired beam quality. For example, the analyzed signal can be fed back to the laser 30, to have the laser 30 adjust a respective beam quality to be kept, for example, at a maximum. For example, adjusting the laser can involve adjusting one or more (optical) components of the laser. For example, also, the analyzed signal can be fed back to one or more adjustable components that is/are associated with the quality of the beam, to adjust the/those component(s) to achieve an maximum beam quality. Also, a dedicated beam quality adjuster (not shown) can be included, that can be controlled using the analyzed signal, to maintain a desired beam quality. Improved beam quality may lead to a higher and more stable radiation source output (e.g., EUV output).

Figure 8:
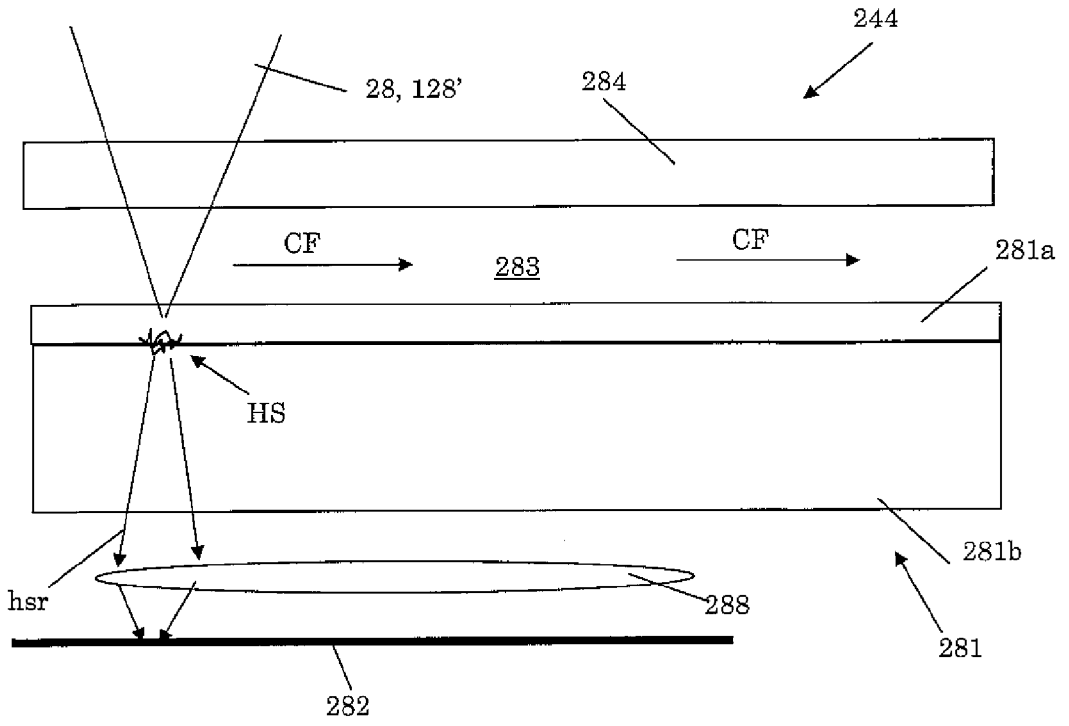
FIG. 8 schematically depicts part of an analyzer module according to an embodiment of the invention.

FIG. 8 depicts an embodiment of part of a Schack Hartmann type analyzer module 244 that can be in an analyzer any of the above-described embodiments. Particularly, FIG. 8 shows an example of a detector part of the module. The module 244 may be provided with a beam absorber 281, arranged to substantially absorb the second beam or beamlets 28*b*, 128*b*' (emanating from a respective focus system 47, 147 of the module). Also, the analyzer module 244 is provided with a detector 282, configured to detect the radiation absorption.

For example, the detector 282 can be an infrared radiation detector, for example a camera (for example including or be associated with respective imaging optics 288), configured to image the beam absorber 281 to detect hot spots HS thereon/therein. Alternatively, for example, the detector can be a grid of heat sensors that is in thermal contact with the beam absorber 281, for example by being integrated with the beam absorber 281.

The beam absorber 281 can be configured in various different ways. For example, the beam absorber can be a radiation absorbing element, for example a radiation absorbing plate. Also, the absorber 281 can be provided by one or more radiation absorbing layers 281*a* that is/are provided on a suitable support, for example a substrate 281*b*. In a non-limiting embodiment, the radiation absorber 281 comprises a material 281*a* having a small coefficient of heat conduction, for example ULE®, to absorb the radiation of the second beam(s) 28*b*, 128*b*'.

In an embodiment, a cooling system may be provided to remove heat from the beam absorber 281. The cooling system can be configured in various ways, for example, it can be provided with one or more Peltier elements (not shown), arranged to remove heat from the beam absorber 281. In the present embodiment, the cooling system comprises a cooling channel 283 to supply a cooling fluid (for example a cooled or relatively cool gas or liquid, for example cooling water) to the beam absorber 281. A flow of cooling fluid is indicated by arrows CF. The cooling channel as such can be arranged in various ways. In the example, the channel 283 is located in front of a radiation receiving surface of the beam absorber 281. Thus, during operation, the radiation 28*b*, 128*b*' to be absorbed passes the cooling channel 283 (and cooling fluid) before being received by the absorber 281. A channel wall 284 is located opposite the radiation receiving surface of the absorber 281. The wall 284 is substantially transparent to the radiation 28*b*, 128*b*' that is to be absorbed (the same holds for the cooling fluid).

During operation of the analyzer 244 shown in FIG. 8, the beam absorber 281 can be continuously cooled using the cooling fluid (flowing through the channel 283). One or more afore-mentioned second beams 28*b*, 128*b*' are incident towards the absorber 281, in this example by passing the transparent channel wall 284 and cooling fluid (in the channel 283). Preferably, each second beam or beam part is focussed onto the beam absorber 281 by a respective focus unit 47, 147, leading to a respective local hot spot HS.

The location of each hot spot HS (only one being shown) can be continuously monitored by the detector 282. In the drawing, heat radiation hsr emanating from each hot spot HS can be transmitted (in the example through the substrate 281*b*) towards the detector 282. For example, the substrate 281*b* may be made of a material that is at least partly, preferably substantially, transparent to heat radiation. The detector 282 detects the hot spot HS, particularly the location of the hot spot HS in or on the absorber 281.

In this way, wavefront deviations of the laser beam 28 (see FIGS. 4-5) can be monitored accurately, via hotspot detection and shifting of respective hot spot location on/in the absorber material. Heat can be removed from the hot spots HS in an efficient manner, thus preventing blurring of the hot spot, and providing for high speed detection of hot spot shifting.

Embodiments of the invention are not limited to radiation sources which use droplets of material. An embodiment of the invention may for example generate plasma from a gas rather than from droplets of material. Both of these may be considered to be examples of a plasma generating substance. It will be appreciated that embodiments of the invention may be used for any other applicable type of radiation (e.g., EUV radiation) source. However, an embodiment of the invention may be particularly suited to a LPP radiation source.

Although specific reference may be made in this text to the use of lithographic apparatus in the manufacture of ICs, it should be understood that the lithographic apparatus described herein may have other applications, for example the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

Wile specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

What is claimed is:

1. A radiation source, comprising:

a beam generator configured to generate a radiation beam to be used to produce a radiation output of the radiation source, the radiation source configured to focus at least part of the radiation beam onto a focus spot; and a beam monitor configured to monitor a quality of the radiation beam at the focus spot, the beam monitor comprising an analyzer module configured to analyze the radiation beam at a beam analyzing location separate from the beam generator.

2. The radiation source of claim 1, wherein the analyzer module comprises a wavefront sensor configured to determine wavefront deviations in the radiation beam.

3. The radiation source according to claim 2, wherein the wavefront sensor is a Shack-Hartmann interferometer.

4. The radiation source according to claim 1, wherein the quality of the radiation beam relates to one or more of a size, shape, intensity and location of the beam at the focus spot.

5. The radiation source according to claim 1, wherein the radiation source comprises a fuel supplier configured to supply a plasma fuel to a fuel ignition location, and wherein the radiation source is configured to utilize the radiation beam to ignite fuel, present at the ignition location, to generate radiation emitting plasma.

6. The radiation source according to claim 1, wherein the radiation source is configured to produce extreme ultra violet (EUV) radiation by utilizing the radiation beam generated by the beam generator.

7. The radiation source according to claim 1, further comprising an optical system configured to focus at least part of the radiation beam onto the focus spot, wherein at least part of the optical system is part of the beam monitor.

8. The radiation source according to claim 7, wherein the optical system is configured to focus at least part of the radiation beam onto a first focus spot to produce a radiation output, and wherein the optical system is also configured to focus at least part of the radiation beam onto a second focus spot, separate from the first focus spot, the second focus spot being associated with the beam monitor.

9. The radiation source according to claim 1, further comprising a beam steering device configured to direct at least part of the radiation beam towards a plasma fuel ignition location, wherein the beam steering device is also configured to direct at least part of the radiation beam towards the beam analyzing location to be analyzed.

10. The radiation source according to claim 9, wherein the beam steering device is a beam splitter configured to split the incoming beam at least into a first beam part and a second beam part.

11. The radiation source according to claim 1, wherein the beam monitor further comprises a beam divider configured to divide at least part of the radiation beam into a plurality of parts, and wherein the analyzer module is configured to determine a position shift of the parts due to wave front distortion of the beam, with respect to positions of the parts relating to an undistorted wavefront.

12. The radiation source according to claim 1, wherein the radiation source is configured to produce a radiation emitting plasma by utilizing the radiation beam.

13. The radiation source according to claim 1, wherein the analyzer module includes a radiation absorber and a thermal conditioning system to remove heat from the radiation absorber.

14. A lithographic apparatus, comprising:

a radiation source, comprising a beam generator configured to generate a radiation beam to be used to produce a radiation output of the radiation source, the radiation source configured to focus at least part of the radiation beam onto a focus spot, and a beam monitor configured to monitor a quality of the radiation beam at the focus spot, the beam monitor comprising an analyzer module configured to analyze the radiation beam at a beam analyzing location separate from the beam generator;

a support configured to support a patterning device, the patterning device being configured to pattern the radiation output of the radiation source into a patterned beam of radiation; and a projection system configured to project the patterned beam of radiation onto a substrate.

15. A device manufacturing method comprising:

producing a first type of radiation with a radiation source comprising a beam generator configured to generate a beam of second type of radiation to be used to produce the first type of radiation, the radiation source configured to focus at least part of the beam of second type of radiation onto a focus spot, and a beam monitor configured to monitor a quality of the beam of second type of radiation at the focus spot, the beam monitor comprising an analyzer module configured to analyze the radiation beam at a beam analyzing location separate from the beam generator;

patterning the first type of radiation produced by the radiation source; and projecting a patterned beam of radiation onto a substrate.

16. A device manufacturing method comprising:

generating a first type of radiation utilizing a beam of a second type of radiation generated by a beam generator;

monitoring a quality of the beam of the second type of radiation at a focus spot by analyzing the second type of radiation at a beam analyzing location separate from a location of the beam generator; and projecting a patterned beam of the first type of radiation onto a substrate.

* * * * *